United States Patent
Chen et al.

(10) Patent No.: US 6,737,362 B1
(45) Date of Patent: May 18, 2004

(54) METHOD FOR MANUFACTURING A THIN GATE DIELECTRIC LAYER FOR INTEGRATED CIRCUIT FABRICATION

(75) Inventors: Chia Lin Chen, Hsin-Chu (TW); Chun-Lin Wu, Hsin-Chu (TW); Chi-Chun Chen, Kaoshiung (TW); Tze Liang Lee, Hsin-Chu (TW); Shih-Chang Chen, Taoyuang (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 0 days.

(21) Appl. No.: 10/377,568

(22) Filed: Feb. 28, 2003

(51) Int. Cl.[7] .................. H01L 21/3105; H01L 21/316; H01L 21/3205
(52) U.S. Cl. .................. 438/776; 438/762; 438/770
(58) Field of Search .................. 438/216, 287, 438/591, 763, 778, 783, 785, 786

(56) References Cited

U.S. PATENT DOCUMENTS

| 5,972,800 A | * 10/1999 | Hasegawa .................. 438/775 |
| 6,528,856 B1 | * 3/2003 | Bai et al. .................. 438/591 |
| 6,555,485 B1 | * 4/2003 | Liu et al. .................. 438/763 |

FOREIGN PATENT DOCUMENTS

| JP | 02-018934 | * 1/1990 | ......... H01L/21/318 |

OTHER PUBLICATIONS

T. Hori et al. Electrical and Physical Properties of Ultrathin Reoxidized Nitrided Oxides Prepared by Rapid thermal Processing. IEEE 1989, pp. 340–350.*

D.K. Shiih et al., Short–Channel MOSFETs With Oxynitride Gate Dielectrics Fabricated Using Multiple Rapid Thermal Processing. Electronics Letters, Feb. 1989, pp. 190–191.*

* cited by examiner

*Primary Examiner*—Long Pham
*Assistant Examiner*—Anh Duy Mai
(74) *Attorney, Agent, or Firm*—Haynes and Boone, LLP

(57) ABSTRACT

The present disclosure provides a method for forming a gate stack structure for semiconductor devices. The disclosed method comprises steps such as forming a dielectric layer on a substrate; applying a plasma nitridation process on the formed dielectric layer; applying a first anneal process on the deposited dielectric layer; etching the dielectric layer to a predetermined thickness using a diluted etchant; applying a second anneal process using an oxygen environment on the etched dielectric layer after the etching; and forming a gate electrode layer on top of the dielectric layer. The etching makes the top portion of the etched dielectric layer have a significantly higher concentration of nitrogen than the lower portion of the etched dielectric layer so as the leakage current is significantly reduced.

17 Claims, 3 Drawing Sheets

METHOD FOR MANUFACTURING A THIN GATE DIELECTRIC LAYER FOR INTEGRATED CIRCUIT FABRICATION

BACKGROUND

The present disclosure relates generally to the fabrication of semiconductor devices and, more particularly, to a method and process for forming a gate stack structure with an extra thin oxide layer.

Semiconductor device geometries have dramatically decreased in size since such devices were first introduced several decades ago. Since then, integrated circuits have generally followed the two year/half-size rule (often called Moore's Law), which means that the number of devices on a chip doubles every two years. Today's fabrication plants are routinely producing devices having 0.35 .mu.m and even 90 nm feature sizes.

Presently, there is a great demand for shrinking semiconductor devices to provide an increased density of devices on the semiconductor chip that are faster and consume less power. The scaling of devices in the lateral dimension requires vertical scaling as well so as to achieve adequate device performance. This vertical scaling requires the effective electrical thickness of the gate dielectric to be reduced so as to provide the required device performance. Silicon dioxide has been the preferred gate dielectric material. However, newer technologies are requiring effective thicknesses of the silicon dioxide below currently believed limits (e.g., <10 Angstroms). Further, for deep sub-micron CMOS devices and circuits, gate dielectrics have been scaled down aggressively toward direct tunneling region. For ultra-thin SiO$_2$, leakage current will increase tremendously as thickness is reduced. This will cause large standby power consumption, thus making products commercially not acceptable.

For the application of smaller CMOS devices such as 0.065 um devices, SiO$_2$ is not a feasible choice for the gate dielectric, and a new gate dielectric must be created with thin dielectric thickness, low leakage current density and high driving capability.

In addition, even with new gate dielectric materials, the increasing problems of excessive gate leakage current in ultra thin oxide and the dopant impurity penetration have becoming the major obstacles for the continuing downscaling of CMOS technology. Different nitridation methods have been proposed to replace pure SiO$_2$ because of leakage current and effective oxide thickness reduction ability. For example, ultra thin nitride/oxide(N/O) stack gate dielectric and Decouple Plasma Nitrogen (DPN) have been proposed as viable alternatives to silicon dioxide for 0.1 um device because of their good impurity diffusion barrier property and low gate leakage current density. However, it is difficult to shrink the dielectric thickness in N/O stack gate or nitrided oxide. Although, it is theoretically possible to shrink the dielectric thickness in N/O stack gate or nitrided oxide and reduce the gate leakage current density, the drain current will be deteriorated. Moreover, plasma direct treatment on gate dielectric can easily induce the oxide damage and then reduce the carrier mobility and driving current.

What is needed is a new process to form a gate stack structure with thin oxide and with low leakage current.

SUMMARY

The present disclosure provides a method for forming a gate stack structure for semiconductor devices requiring a thin dielectric layer. The disclosed method comprises steps such as forming a dielectric layer on a substrate; applying a plasma nitridation process on the formed dielectric layer; applying a first anneal process on the deposited dielectric layer; etching the dielectric layer to a predetermined thickness; applying a second anneal process using an oxygen environment on the etched dielectric layer after the etching; and forming a gate electrode layer on top of the dielectric layer. The etching makes the top portion of the etched dielectric layer have a significantly higher concentration of nitrogen than the lower portion of the etched dielectric layer so as the leakage current is significantly reduced.

In one example, a novel gate stack manufacturing process is provided to gain a low leakage current density, high drain current and less boron penetration performance by combining decouple plasma nitridation treatment, post nitridation anneal, and diluate etchant etch back process. Another benefit is that there is no complicated nitridation process introduced. The etch back process is fully compatible with the current CMOS process flow and does not require any new equipment or new process design.

DETAILED DESCRIPTION

The present disclosure can be described by the embodiments given below. It is understood, however, that the embodiments below are not necessarily limitations to the present disclosure, but are used to describe typical implementations of the invention. For example, 65 nm devices are used as sample devices for illustrating the manufacturing process, but the present disclosure intends to encompass devices of other feature sizes in which the relevant thickness of the gate oxide layer may change accordingly.

As discussed above, in general there is a need to reduce the dielectric thickness to facilitate device scaling and integration. Accordingly, it is desired to have dielectric material(s) which result in the same capacitance as a particular thickness of silicon dioxide, but which can be processed with less complications and which do not suffer from the electrical shortcomings of ultra-thin layers of silicon dioxide.

Figure 1:
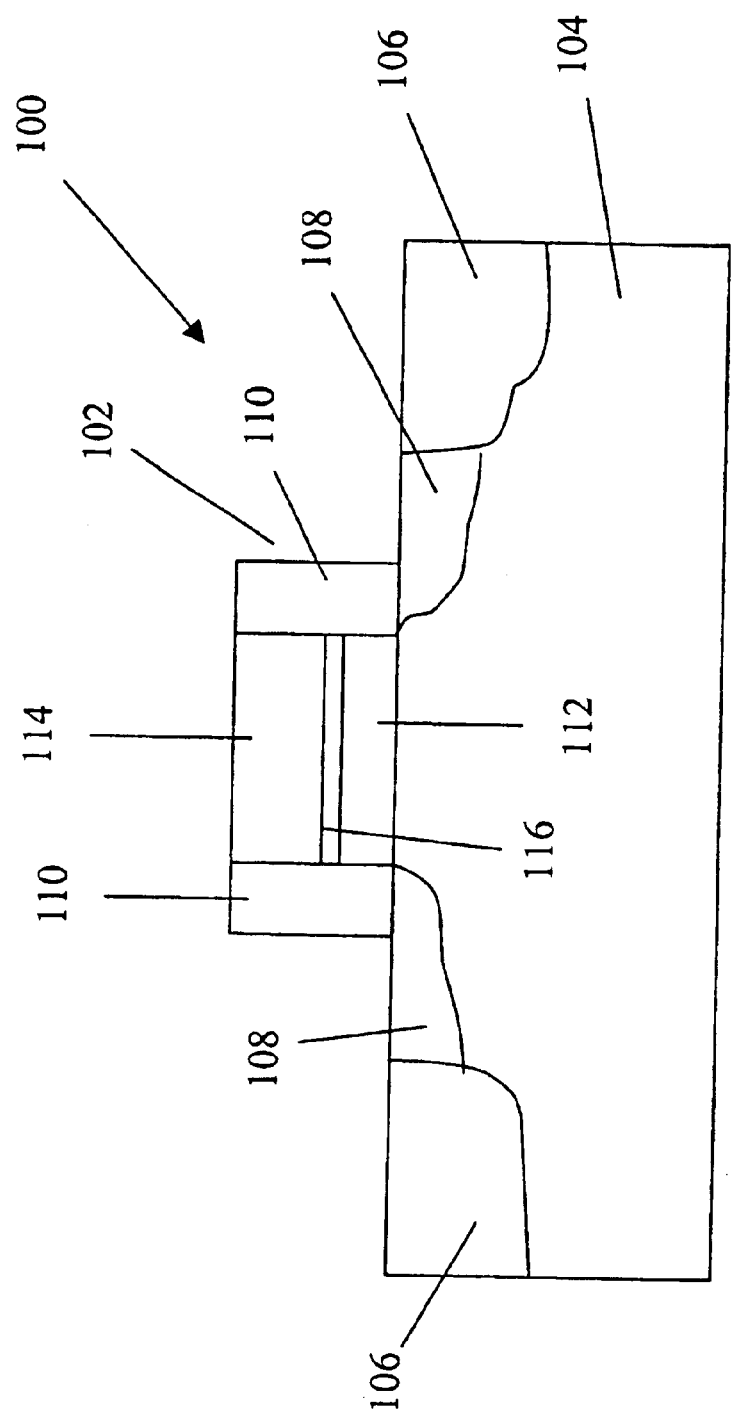
FIG. 1 illustrates a MOSFET transistor having a gate stack.

FIG. 1 illustrates a MOSFET transistor 100 having a gate stack 102 for a 65 nm device. Transistor 100 is located on a semiconductor substrate 104 and is separated from other electronic entities on the same substrate by isolation materials 106, which may be shallow trench isolations. Source/drain regions 108 are located on opposite sides of gate stack 102.

Gate stack 102 comprises two sidewall spacers 110, a layer of gate oxide/dielectric material 112 situated on top of the substrate 104, and a gate electrode 114. The dielectric layer can be made of high-K dielectric material. The thickness of dielectric layer 112 is on the order of 50 to 110 .ANG. On top of the dielectric layer 112, there may be a layer of nitride 116 with a thickness on the order of 2–10 .ANG. The gate electrode 114 may comprise polysilicon as the nitride layer 116 will prevent the formation of silicon dioxide. The gate electrode 114 can also comprise a metal. The metal chosen may need to be matched to the dielectric layer in terms of process integration and its work function that ultimately dictates the threshold voltage of the device.

A method for forming gate stack 102 according to an embodiment of the invention will now be described. FIGS. 2A–D illustrate the process for manufacturing such a gate stack. Initially, a gate oxide/dielectric layer 200 is deposited on the substrate. Since the material used for forming the gate oxide layer can vary in a great deal due to the differences in processes or devices, the thickness of the gate oxide layer 200 is hereafter measured by the thickness of an equivalent pure oxide in terms of its capacitance. In the immediate example, the deposited gate oxide layer 200 can be equivalent to the thickness of a pure oxide that is in the range of 10–25 .ANG.

The gate oxide may be formed using the Rapid Thermal Oxidation (RTO) process. Thermal oxides can grow in a RTO chamber/system at temperatures ranging from 800° C. to 1100° C. The effects of the oxidation process mainly depend on process-temperature and process time. Because of the short ramping times of about 30° C. $s^{-1}$ (for ramping up) and about 20° C. $s^{-1}$ (for ramping down), the complete ramping for the RTO is done in an oxygen atmosphere. During the oxidation process, oxygen source such as pure $O_2$, or composite oxygen source such as $N_2O$ or NO can be used.

After the RTO process is done, a nitridation process such as de-couple plasma nitridation (DPN) or remote plasma nitridation (RPN) is done to form the thin nitride layer 116. DPN is a high temperature anneal process done in a nitrogen ambient (such as NO, $NH_3$, $N_2O$). After the nitridation, a post nitridation anneal (PNA) is further applied in an ambient of $O_2$ or $N_2$. The nitridation process provides a good impurity diffusion barrier and reduces the gate current leakage.

Figure 2C:
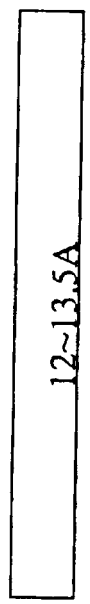
FIGS. 2A–2D illustrate a process for manufacturing an improved gate stack using an etch-back process according to one example of the present disclosure.
Figure 2D:
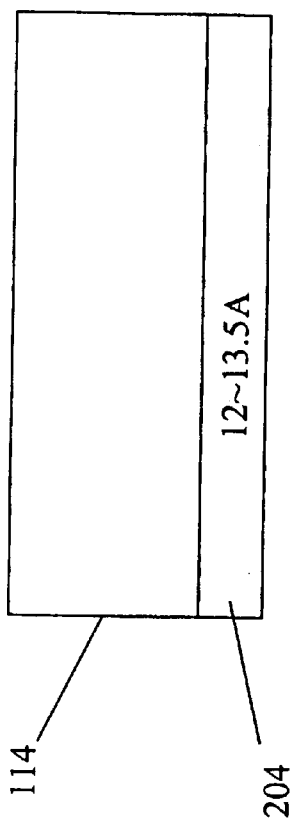
Figure 2A:
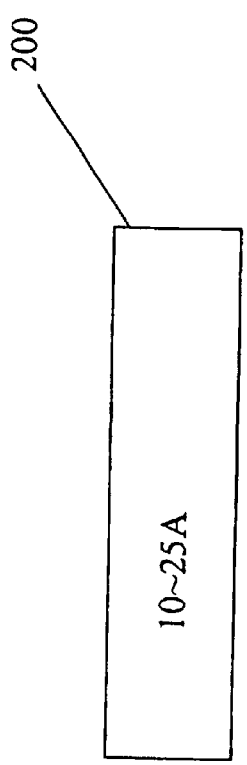
Figure 2B:
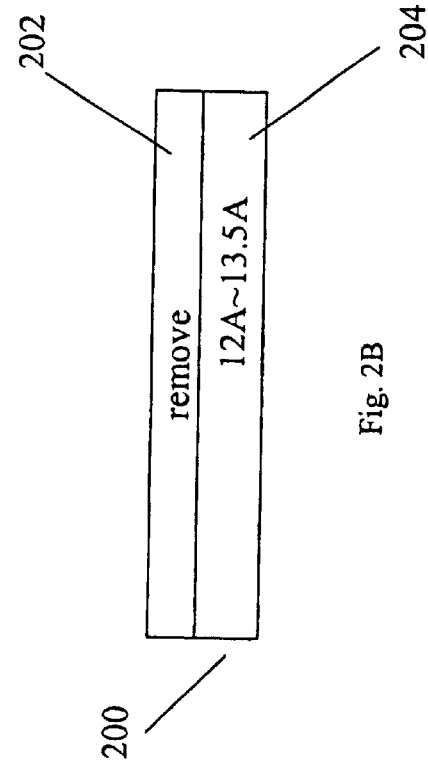

FIG. 2B shows that a portion 202 of the gate oxide layer 200 is removed by an etch process to reduce the thickness of the gate oxide to about 12–13.5 .ANG. A wet etch back process using HF as the etchant can be applied. It is understood that etch rate can monitor the nitrogen profile incorporated in the gate oxide. It is preferred that the HF is diluted for slowing down the etching process so that the etching process can be better controlled. For example, the HF can be diluted to 300:1 ratio to obtain controllable etching rate. The etch back process is important to improve the features of the gate oxide. After the etch back process, the thickness of the gate oxide layer is reduced to the equivalent thickness of 8–15 .ANG. Moreover, the etch back process makes the concentration of the nitrogen in the top portion of the etched gate oxide layer significantly higher than that in the lower portion of the gate oxide layer. Such a difference helps to enhance the reduction of leakage current in the gate. For example; experiments have shown that the leakage current has been reduced in at least half by using the etch back process.

The remaining portion of the gate oxide 204 is now going through a post anneal process in which it is exposed to oxygen environment with oxygen sources such as $O_2$, $N_2$, $N_2O$ or No (FIG. 2C). After the treatment, the gate electrode 114 is deposited on top of the gate oxide 204.

Figures 3A, 3B:
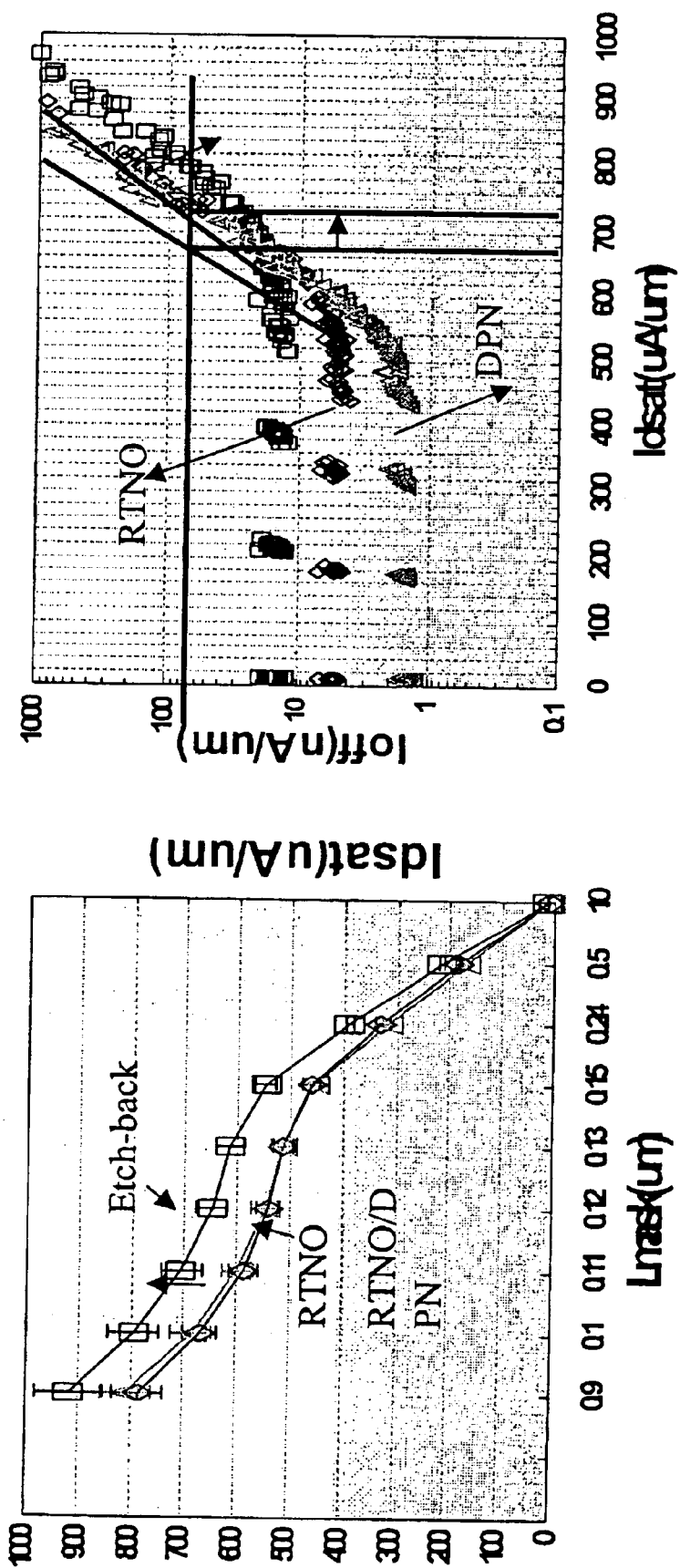
FIGS. 3A–B illustrate that the gate oxide produced using the etch back process has la significant electrical property.

Using the etch back process as described above improves the quality of the gate oxide significantly. FIG. 3A–B illustrates that the gate oxide produced using the etch back process has significant electrical property. It is noticed that with the above described method, in terms of measurements, the $Id_{sat}$ can reach about 800 uA/um if $I_{off}$ is kept at about 75 nA/um. As shown, it gets over 50 uA/um $I_{dsat}$-$I_{off}$ window improvement than the conventional thermal nitridation or DPN process for NMOS devices. Further, the etch back process described above produces the gate oxide layer that enjoys about two times Jg reduction comparing to oxides produced by conventional thermal rapid thermal nitridation and oxidation. Most importantly, the etch back process allows the reduction of the gate oxide to thinner than 15 .ANG for running a CMOS manufacturing process for producing 65 nm devices. It is noticed that neither the conventional thermal nitridation or the DPN process can reduce the thickness of the gate oxide layer to less than 20 .ANG.

The invention has been described in conjunction with a 65 nm MOSFET transistor. It will be apparent to those of ordinary skill in the art that the benefits of the invention can be applied to other transistor sizes with appropriate scaling of the dimensions described herein. The benefits can also be applied to transistor structures different from that described above, such as those transistors having raised source/drain regions. One of the benefits is that there is no complicated nitridation process is introduced. The etch back process is fully compatible with the current CMOS process flow and does not require any new equipment or new process design. In addition, the gate stack structure thus produces has an extra thin dielectric layer, a low leakage current density, and high driving capability.

It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A method for forming a gate oxide layer for devices of small feature sizes, the method comprising:

forming a gate oxide layer on a substrate;

applying a nitridation process on the formed gate oxide layer;

etching the gate oxide layer back to a predetermined thickness after the nitridation process; and applying an anneal process using an oxygen environment on the etched gate oxide.

2. The method of claim 1 wherein the nitridation process further comprises applying an post-nitridation anneal process on the gate oxide layer.

3. The method of claim 1 wherein the nitridation process is a plasma nitridation process.

4. The method of claim 1 wherein the etching uses diluted etchant.

5. The method of claim 1 wherein the thickness of the gate oxide layer on the substrate is equivalent to about 10 to 25 .ANG of pure oxide.

6. The method of claim 1 wherein the thickness of the d posited gate oxide layer is reduced to a thickness equivalent to about 8 to 15 .ANG of pure oxide after the etching.

7. The method of claim 1 wherein the device feature size is smaller than 0.1 um.

8. The method of claim 1 wherein the etching causes the nitrog n concentration in the top portion of the gate oxide layer to be significantly higher that that in the lower portion.

9. A method for forming a gate stack structure for semiconductor devices of small feature sizes, the method comprising:

forming a gate oxide layer on a substrate for a thickness in a range that is equivalent to 10–25 .ANG of pure oxide;

applying a nitridation process on the formed gate oxide to establish a thin nitride layer;

etching the gate oxide to a thickness in a range that is equivalent to 8–15 .ANG of pure oxide;

applying an anneal process after the etching in an oxygen environment; and forming a gate electrode layer on top of the gate oxide.

10. The method of claim 9 further comprising applying an anneal process after the nitridation process in an ambient either of oxygen or nitrogen.

11. A method for forming a gate stack structure for semiconductor devices, the method comprising:

forming a dielectric layer on a substrate;

applying a plasma nitridation process on the formed dielectric layer;

applying a first anneal process on the deposited dielectric layer;

etching the dielectric layer to a predetermined thickness using a diluted etchant;

applying a second anneal process using an oxygen environment on the etched dielectric layer after the etching; and forming a gate electrode layer on top of the dielectric layer, wherein the etching makes the top portion of the etched dielectric layer have a significantly higher concentration of nitrogen than the lower portion of the etched dielectric layer so that a leakage current is significantly reduced.

12. A method for forming a gate stock structure for semiconductor devices, the method comprising:

forming a dielectric layer on a substrate;

applying a nitridation process on the formed dielectric layer;

etching the dielectric layer to a predetermined thickness of less than the equivalent of 15 .ANG of a pure oxide in terms of its capacitance;

applying an anneal process using an oxygen environment on the dielectric layer after the etching; and forming a gate electrode layer on top of the dielectric layer, wherein the etching makes the top portion of the etched dielectric layer have a significantly higher concentration of nitrogen than the lower portion of the etched dielectric layer so that a leakage current is significantly reduced.

13. The method of claim 12 wherein the nitridation process further comprises applying an post-nitridation anneal process on the dielectric layer.

14. The method of claim 12 wherein the nitridation process is a remote plasma nitridation process or a de-couple plasma nitridation process.

15. The method of claim 12 wherein the etching uses a diluted etchant for bett r monitoring a nitrogen profile in the dielectric layer.

16. The method of claim 12 wherein the thickness of the dielectric layer on the substrate is equivalent to about 10 to 25 .ANG of pure oxide in terms of its capacitance for a device having a feature size smaller than 100 nm.

17. The method of claim 16 wherein the thickness of the dielectric layer is reduced to a thickness equivalent to about 8 to 13 .ANG of pure oxide in terms of its capacitance after the etching.

* * * * *

UNITED STATES PATENT AND TRADEMARK OFFICE
CERTIFICATE OF CORRECTION

PATENT NO. : 6,737,362 B1  
DATED : May 18, 2004  
INVENTOR(S) : Chia Lin Chen et al.

It is certified that error appears in the above-identified patent and that said Letters Patent is hereby corrected as shown below:

Column 2,
Line 31, the word "la" should be replaced with -- a --;

Column 4,
Lines 57 and 58, the word "d posited" should be replaced with -- deposited --;
Line 63, the word "nitrog n" should be replaced with -- nitrogen --;

Column 6,
Line 25, the word "bett r" should be replaced with -- better --;

Signed and Sealed this

Fifth Day of April, 2005

JON W. DUDAS  
*Director of the United States Patent and Trademark Office*